(12) United States Patent
Wolgemuth et al.

(10) Patent No.: US 12,174,269 B2
(45) Date of Patent: Dec. 24, 2024

(54) CURRENT SENSING IN A WIRELESS POWER TRANSFER SYSTEM

(71) Applicant: InductEV, Inc., Malvern, PA (US)

(72) Inventors: John M. Wolgemuth, Chester Springs, PA (US); Benjamin H. Cohen, Malvern, PA (US); Daniel S. Hackman, Ephrata, PA (US)

(73) Assignee: InductEV, Inc., King of Prussia, PA (US)

( * ) Notice: Subject to any disclaimer, the term of this patent is extended or adjusted under 35 U.S.C. 154(b) by 162 days.

(21) Appl. No.: 18/080,642

(22) Filed: Dec. 13, 2022

(65) Prior Publication Data

US 2023/0105687 A1    Apr. 6, 2023

Related U.S. Application Data

(63) Continuation-in-part of application No. 17/181,349, filed on Feb. 22, 2021, now Pat. No. 11,784,503, and
(Continued)

(51) Int. Cl.
*G01R 31/72* (2020.01)
*G01R 19/02* (2006.01)
*G01R 19/25* (2006.01)

(52) U.S. Cl.
CPC .................................. *G01R 31/72* (2020.01)

(58) Field of Classification Search
CPC ..... G01R 19/25; G01R 19/0092; G01R 19/02
See application file for complete search history.

(56) References Cited

U.S. PATENT DOCUMENTS

| 4,182,982 A | 1/1980 | Wolf et al. |
| 4,553,084 A | 11/1985 | Wrathall |

(Continued)

FOREIGN PATENT DOCUMENTS

| CA | 2125026 C | 6/1998 |
| CN | 110912278 A | 3/2020 |

(Continued)

OTHER PUBLICATIONS

European Extended Search Report received in European Application No. 20931217.2, dated May 27, 2024.
(Continued)

*Primary Examiner* — Jermele M Hollington
*Assistant Examiner* — Temilade S Rhodes-Vivour
(74) *Attorney, Agent, or Firm* — Michael P. Dunnam; Culhane Meadows PLLC

(57) ABSTRACT

A current sensing method measures a fractional current through a coil having a plurality of coil windings by using a current sensing resistor to measure a current through a subset of the plurality of coil windings and using a voltage sensor to measure a voltage drop across the current sensing resistor. The measured current and voltage values are provided to a processor to determine the fractional current and phase of the coil. For example, the fractional current and phase of the coil may be determined by calculating a total current of the coil as $I=n(V/Rx)$, where n is the number of coil windings of the coil, V is the measured voltage, and Rx is the impedance of the current sensing resistor. The coil may be a secondary winding used in a wireless power transfer system.

16 Claims, 4 Drawing Sheets

Related U.S. Application Data a continuation-in-part of application No. 16/825,624, filed on Mar. 20, 2020, now Pat. No. 11,585,836.

(56) References Cited

U.S. PATENT DOCUMENTS

| | | | |
|---|---|---|---|
| 5,045,770 A | 9/1991 | Brooks | |
| 5,990,640 A | 11/1999 | Dwyer et al. | |
| 6,072,708 A | 6/2000 | Fischer | |
| 6,307,345 B1 | 10/2001 | Lewis | |
| 6,522,517 B1 | 2/2003 | Edel | |
| 6,670,792 B1 | 12/2003 | Renehan | |
| 6,954,060 B1 | 10/2005 | Edel | |
| 6,984,979 B1* | 1/2006 | Edel | G01R 15/185 324/253 |
| 8,238,127 B1* | 8/2012 | Sadwick | G05F 1/455 363/126 |
| 10,416,196 B2 | 9/2019 | Urankar | |
| 10,802,049 B2 | 10/2020 | Park et al. | |
| 10,992,149 B1 | 4/2021 | Kahn et al. | |
| 2003/0155813 A1 | 8/2003 | Walter | |
| 2005/0024016 A1 | 2/2005 | Breen et al. | |
| 2006/0203401 A1 | 9/2006 | Kojori et al. | |
| 2007/0021937 A1 | 1/2007 | Labuschagne et al. | |
| 2008/0212345 A1 | 9/2008 | Yamashita et al. | |
| 2009/0026845 A1 | 1/2009 | Shin | |
| 2010/0090539 A1 | 4/2010 | Auchterlonie | |
| 2010/0164296 A1 | 7/2010 | Kurs et al. | |
| 2012/0326515 A1* | 12/2012 | Murai | H02J 50/12 307/72 |
| 2013/0183043 A1* | 7/2013 | Elberbaum | H01F 38/30 324/123 R |
| 2013/0282312 A1 | 10/2013 | Abeywickrama et al. | |
| 2013/0289334 A1 | 10/2013 | Badstibner et al. | |
| 2014/0119072 A1 | 5/2014 | Behrends et al. | |
| 2014/0142873 A1 | 5/2014 | Kawate et al. | |
| 2014/0339916 A1 | 11/2014 | Fells et al. | |
| 2015/0194836 A1 | 7/2015 | Teo et al. | |
| 2015/0207333 A1 | 7/2015 | Baarman et al. | |
| 2015/0263511 A1 | 9/2015 | Sandner et al. | |
| 2016/0025821 A1 | 1/2016 | Widmer et al. | |
| 2016/0181875 A1 | 6/2016 | Long et al. | |
| 2016/0254659 A1 | 9/2016 | Chambon et al. | |
| 2016/0294221 A1 | 10/2016 | Maniktala | |
| 2017/0187230 A1 | 6/2017 | Tschirhart | |
| 2017/0207746 A1 | 7/2017 | Yoscovich et al. | |
| 2017/0237340 A1 | 8/2017 | Long et al. | |
| 2017/0346343 A1 | 11/2017 | Atasoy et al. | |
| 2018/0040416 A1 | 2/2018 | Lestoquoy | |
| 2018/0054113 A1* | 2/2018 | Kim | H02M 1/083 |
| 2019/0084433 A1 | 3/2019 | Wang et al. | |
| 2019/0148065 A1 | 5/2019 | Naruse et al. | |
| 2019/0157907 A1 | 5/2019 | Sugiyama et al. | |
| 2019/0386518 A1 | 12/2019 | de Rooij et al. | |
| 2020/0150154 A1 | 5/2020 | Chang et al. | |
| 2020/0169124 A1* | 5/2020 | Mehas | H02J 50/12 |
| 2020/0287382 A1 | 9/2020 | Gao et al. | |
| 2021/0066904 A1 | 3/2021 | Ionescu et al. | |
| 2021/0288610 A1 | 9/2021 | Yoscovich et al. | |
| 2022/0091172 A1 | 3/2022 | Varga et al. | |

FOREIGN PATENT DOCUMENTS

| | | |
|---|---|---|
| CN | 111712992 A | 9/2020 |
| EP | 3534493 A1 | 9/2019 |
| WO | 2018222669 A1 | 12/2018 |
| WO | 2019034593 A1 | 2/2019 |

OTHER PUBLICATIONS

International Search Report and Written Opinion received in Patent Cooperation Treaty Application No. PCT/US2020/67339 dated Mar. 23, 2021.

International Search Report and Written Opinion received in Patent Cooperation Treaty Application No. PCT/US2021/023259, dated Jul. 29, 2021.

International Search Report and Written Opinion received in Patent Cooperation Treaty Application No. PCT/US2022/011866, mailed Mar. 29, 2022.

Kim, Jonathan C., et al., "DC Arc Fault Model Superimposing Multiple Random Arc Noise States on an Average Model", 20th Workshop on Control and Modeling for Power Electronics, Jun. 17-20, 2019.

Miao, Wenchao, et al., "Arc-Faults Detection in PV Systems by Measuring Pink Noise With Magnetic Sensors", IEEE Transactions on Magnetics, vol. 55, No. 7, Jul. 2019.

\* cited by examiner

CURRENT SENSING IN A WIRELESS POWER TRANSFER SYSTEM

CROSS-REFERENCE TO RELATED APPLICATION

The present application claims priority to U.S. patent application Ser. No. 16/825,624, filed Mar. 20, 2020, and U.S. patent application Ser. No. 17/181,349, filed Feb. 22, 2021. The contents of these applications are hereby incorporated by reference.

TECHNICAL FIELD

This disclosure relates to current measurement and, more particularly, to current measurement in a wireless power transfer system.

BACKGROUND

Resonant induction wireless charging makes use of an air core transformer consisting of two concentric coils displaced along a common coil axis. Electrical power is sent from the sending apparatus (i.e. the primary coil) to the receiving apparatus (i.e. the secondary coil) by means of magnetic flux linkage between the two transfer coils. An alternating current flowing in the primary coil induces an alternating current into the secondary coil.

One option for constructing coils is use of Litzendraht (aka Litz) wire or other conductive filaments. Litz wire consists of individually insulated wires twisted or braided into a uniform pattern with the primary benefit of reducing AC losses in high frequency windings. Alternately, as described in PCT Patent Application US2018035060, "WIRELESS POWER TRANSFER THIN PROFILE COIL ASSEMBLY," the coil conductors can be comprised of multiple conductive traces layered into an insulative, dielectric substrate (e.g. a printed circuit board).

An electric current is defined as an electric charge (e.g. electrons) in motion. Current is dq/dt, or the time rate of change of charge. The measure of flow of the current of electricity is expressed in amperes. The unit ampere (A) is defined as equal to a flow of one coulomb of charge per second. Measurement of current in an electrical circuit may be accomplished directly (e.g. using a sense resistor) or indirectly (e.g. using a Hall-effect sensor or an inductive sensor).

It is desired to provide a current measurement device for the high currents that may exist in wireless power transfer systems without adversely affecting the operation of the wireless power transfer system.

SUMMARY

Various details for the embodiments of the inventive subject matter are provided in the accompanying drawings and in the detailed description text below.

In sample embodiments, a method of measuring current through a coil comprising a plurality of coil windings is provided. The method includes connecting an alternating current (AC) sense circuit including a current sensing resistor between a power storage subsystem and a rectification subsystem that receives an AC signal from the plurality of coil windings. The AC sense circuit includes a first path including at least one filter capacitor and the current sensing resistor and a second path in parallel with the first path. The second path includes a smoothing capacitor, and the current sense resistor measures a current through the plurality of coil windings. The first and second paths are in parallel with the power storage subsystem. The method further includes measuring a voltage drop across the current sensing resistor and determining a fractional current and phase of the coil from the measured current and voltage.

The method may further include placing the current sensing resistor in line with the at least one filter capacitor so as to receive a ripple current added to a direct current (DC) load current by the rectification subsystem, wherein the current sensing resistor and the at least one filter capacitor eliminate the DC load current from the rectification subsystem to allow a voltage measurement of the ripple current. The method may also include bandpass filtering and amplifying a voltage produced by the ripple current over the current sensing resistor by a low noise amplifier, passing a filtered and amplified voltage over a bus to a digitizer, and sampling, by the digitizer, the filtered and amplified voltage at a frequency over an expected Nyquist rate. An output of the digitizer may be sent to a vehicle charging controller of a vehicle to be charged by the coil using wireless power transfer. The method may further include switching states of the rectification subsystem using the vehicle charging controller and combining the calculated total current with the switch states of the rectification subsystem to determine a current waveform output by the rectification subsystem.

In sample configurations, the coil is a secondary winding used in a wireless power transfer system comprising the rectification subsystem, wherein the rectification subsystem converts an alternating current on the secondary winding into a direct current for application to a load.

In further sample configurations, a loss of load from the power storage subsystem forces a direct current through the AC current sense circuit and the smoothing capacitor. In such as case, the method further includes processing the direct current forced through the AC current sense circuit to produce a signal and providing the signal to the rectification subsystem as indicative of the loss of load.

The methods may be implemented by a wireless power transfer system comprising a rectification subsystem, a power storage subsystem. a coil comprising a plurality of coil windings that is configured to provide an alternating current (AC) signal to the rectification subsystem and to provide power to the power storage subsystem, and a current sensing device for measuring current through the coil. In sample configurations, the current sensing device includes an alternating current (AC) sense circuit including a current sensing resistor between the power storage subsystem and the rectification system. The current sensing resistor receives an AC signal from the plurality of coil windings for measuring a current through the plurality of coil windings. The AC sense circuit includes a first path including at least one filter capacitor and the current sensing resistor, a second path in parallel with the first path, wherein the second path includes a smoothing capacitor. The first and second paths are in parallel with the power storage subsystem, and an analog to digital converter further digitizes a voltage across the current sensing resistor and outputs the digitized voltage as a fractional current through the coil. A voltage sensor measures a voltage drop across the current sensing resistor, and a processor that determines the fractional current and phase of the coil from the measured current and voltage.

In sample configurations, the coil is a secondary winding and the rectification subsystem converts an alternating current on the secondary winding into a direct current for application to a load.

The coil windings may include Litz wire, printed circuit board traces, and/or conductive filaments and are impedance matched and tightly coupled via mutual inductance with each other.

In sample configurations, the rectification subsystem may receive an AC current from the plurality of coil windings and provide a direct current (DC) output to the AC current sense circuit.

In further sample configurations, the current sensing resistor is in line with the at least one filter capacitor so as to receive a ripple current added to a DC load current by the rectification subsystem. The current sensing resistor and the at least one filter capacitor eliminate the DC load current from the rectification subsystem to allow a voltage measurement of the ripple current. An amplifier and a digitizer may also be provided. The amplifier bandpass filters and amplifies a voltage produced by the ripple current over the current sensing resistor and passes a filtered and amplified voltage to the digitizer, and the digitizer samples the filtered and amplified voltage at a frequency over an expected Nyquist rate. The digitizer also may provide a digitized output to a vehicle charging controller of a vehicle to be charged by the coil using wireless power transfer, wherein the vehicle charging controller switches states of the rectification subsystem. The processor may further calculate a total current through the coil and combine the calculated total current with switch states of the rectification subsystem to determine a current waveform output by the rectification subsystem. A loss of load from the power storage subsystem may force a direct current through the AC current sense circuit and the smoothing capacitor. The vehicle charging controller may further process the direct current forced through the AC current sense circuit to produce a signal that is sent to the rectification subsystem when the loss of load is detected.

This summary section is provided to introduce aspects of the inventive subject matter in a simplified form, with further explanation of the inventive subject matter following in the text of the detailed description. This summary section is not intended to identify essential or required features of the claimed subject matter, and the particular combination and order of elements listed this summary section is not intended to provide limitation to the elements of the claimed subject matter. Rather, it will be understood that the following section provides summarized examples of some of the embodiments described in the Detailed Description below.

BRIEF DESCRIPTION OF THE DRAWINGS

The foregoing and other beneficial features and advantages of the invention will become apparent from the following detailed description in connection with the attached figures, of which.

DETAILED DESCRIPTION OF ILLUSTRATIVE EMBODIMENTS

Figure 1:
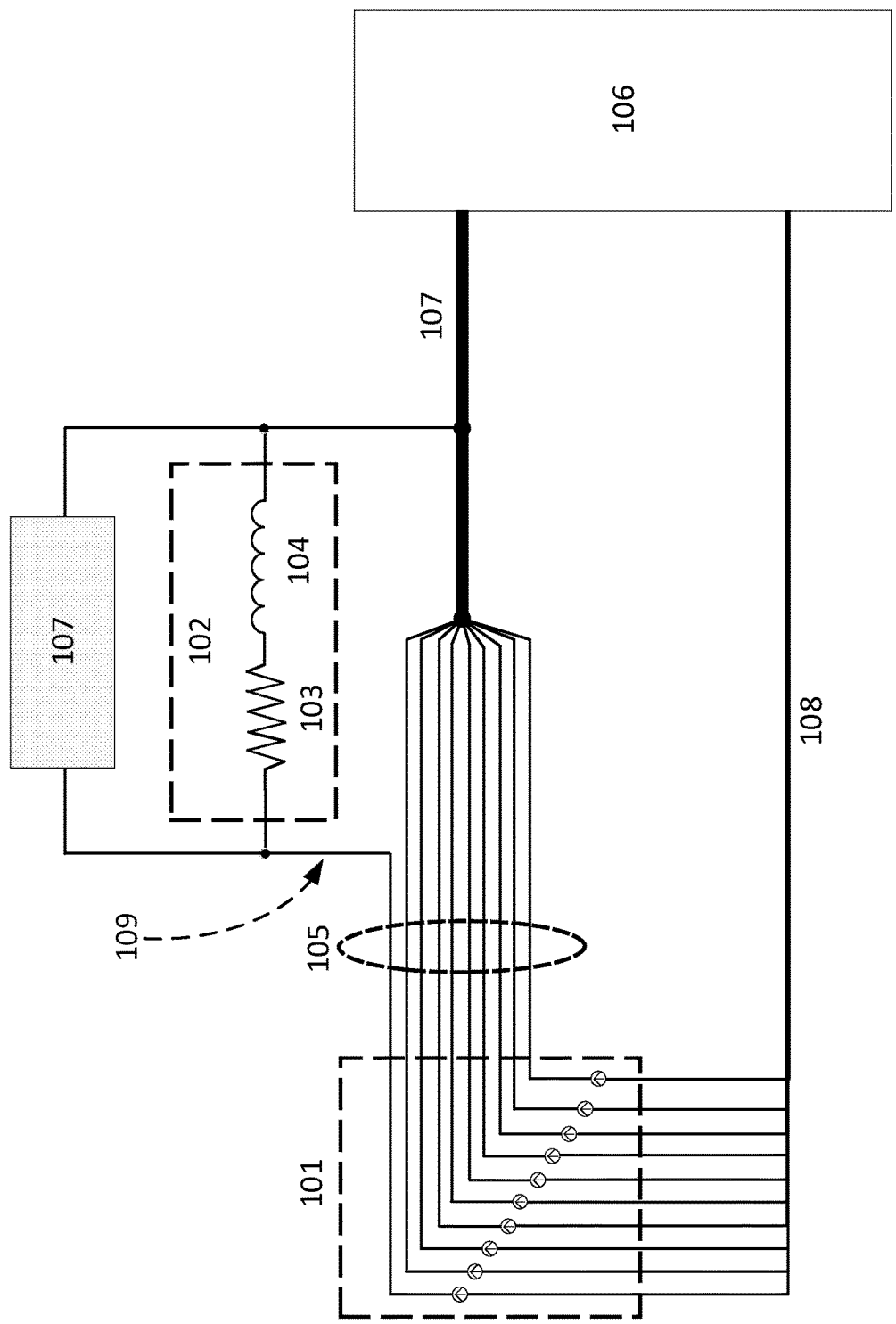
FIG. 1 schematically illustrates current measurement in a wireless power transmission system in a sample embodiment.

The current sensing for wireless power transmission and associated method described herein may be understood more readily by reference to the following detailed description taken in connection with the accompanying figures and examples, which form a part of this disclosure. It is to be understood that this description is not limited to the specific products, methods, conditions or parameters described and/or shown herein, and that the terminology used herein is for the purpose of describing particular embodiments by way of example only and is not intended to be limiting of any claimed subject matter. Similarly, any description as to a possible mechanism or mode of action or reason for improvement is meant to be illustrative only, and the subject matter described herein is not to be constrained by the correctness or incorrectness of any such suggested mechanism or mode of action or reason for improvement. Throughout this text, it is recognized that the descriptions refer both to methods and systems/software for implementing such methods.

A detailed description of illustrative embodiments will now be described with reference to FIGS. 1-4. Although this description provides a detailed example of possible implementations, it should be noted that these details are intended to be exemplary and in no way delimit the scope of the inventive subject matter.

Indirect current sensing is typically used in circuits with load currents in the 100A-1000A range. Indirect current sensing allows galvanic isolation from the conductor under measurement. When using a Hall effect-based sensor, the sensor is installed between the coil and load. The Hall effect sensor uses the Lorentz force (the force exerted on an electron moving through a magnetic field) which creates a voltage difference (the Hall voltage) across an electrical conductor, transverse to the current in the conductor and to an applied magnetic field perpendicular to the current to determine alternating current (AC) and direct current (DC) flow. The inductive current sensor or current sense transformer uses Faraday's law of induction with the conducting wire acting as primary and the voltage output as secondary to measure alternating current (AC) in the conducting wire based on the magnetic flux produced.

Since at high power with a low impedance load, the wireless power transfer (WPT) system will always be a current source (i.e., an AC Voltage Controlled Current Source) and since high power WPT systems will generate stray magnetic flux, use of the indirect measurement techniques and technologies are problematic especially as part of the closed control loop of an active rectifier.

A direct method of current measurement is through use of a sense resistor. The sense resistor, nominally a resistor with a small Ohmic value, is placed in-line with a circuit network, typically close to the circuit ground or battery cathode. The total current through the sense resistor is then measured by measuring the voltage drop across the resistor and computing current as $i(t)=v(t)/R$ where $i(t)$ is the current, in amperes, as a function of time, $v(t)$ is the voltage across the sense resistor, in volts, as a function of time, and R is the resistance of the sense resistor, in Ohms. The sense resistor is selected to have a minimal resistance to avoid excessive heating and perturbation of the power delivery to the load (because power loss in the sense resistor is proportional to the resistance).

For alternating current systems, such as for use in a magnetic resonance-based WPT system, the sense resistor selected should have a minimal reactance component of the total impedance for the same reasons. The requirement for a precise AC signal measurement (e.g. current, frequency, phase), at the frequency of concern, drives the requirement for a reactance that must be small relative to the resistance.

The use of a current sense resistor in a high current system (e.g., 125 Amps RMS and higher) to measure the full AC current is prohibitive due to power dissipation heating. Another issue is the physics of construction of a resistor physically large enough to handle that current without creating a large unavoidable inductance. The additional parasitic inductance may then add too much phase angle to the AC signal for an accurate measurement.

However, a fractional current sensing method can be constructed for a WPT system that exploits the multi-conductor construction of the secondary's coil windings to separate a subset of the conductors which are then connected through a resistor with a low Ohm rating. The conductor current passes through the very small value resistor (with the inherent parasitic inductance) and the voltage drop is measured across the resistor to determine the fractional current and phase.

A current sensing resistor is low cost and remains reliable even in the presence of stray magnetic flux generated by the WPT system. However, because the current sense resistor is a resistive element (albeit one with some self-inductance), the heat it generates is proportional to the square of current passing therethrough, limiting its usefulness in a high current power supply like that used in a WPT system. However, by exploiting the multi-element construction of a magnetic coil, a sense resistor placed on a single conductor can produce a measurement of the fractional current without generating excessive heat, while also not impinging on the power delivery capabilities of the system as a whole. This fractional current measurement provides accurate phase measurement with multiplication and accurate current measurement for the control system (e.g., the active rectification system and power control feedback).

In practice, any resistor includes an inevitable parasitic inductance. This inductance leads to a phase shift in the output. Since the measured conductor is returned to the bundle of tightly coupled parallel conductors, and through mutual inductance shares the total current load, the power reduction may be far more than that of the just resistive heating loss.

Since resistor construction varies, a low inductance model can be selected. Since the impact of the resistor on delivered power (and dissipative heating) is reduced by the fraction of conductors sensed over the total number of conductors, in the fractional current measurement system, a larger Ohm (relatively) resistor can be selected to reduce the relative impact of the self-inductance component. The larger resistor value also creates a greater dynamic voltage range for more precise voltage and thus fractional current level and current phase sensing.

In sample embodiments, the sensing resistor is selected to limit inductance or to use a high but still relatively low value to reduce impact of the inductor while keeping heating and power loss to a minimum. A higher resistance provides a higher dynamic range for voltage leading to more accurate current sensing. The inductance is also limited to prevent out-of-phase subtraction when measured current returns to the tightly coupled bundle of conductors.

FIG. 1

In FIG. 1, multiple conductors (e.g., Litz wire, printed circuit board traces, or conductive filaments) are used in the secondary coil of a WPT system (e.g. an inductive system, a magnetic resonant coupled inductive system, or even a capacitively coupled system). The secondary 101 appears in the circuit as a bank of independent current supplies each with its own conductor 105. Each conductor 105 is impedance matched and tightly coupled, via mutual inductance, with the other conductors 105. FIG. 1 uses ten conductors 105 for purposes of illustration only. The load 106 is supplied with power from the secondary 101 via a power bus 107 that combines the individual conductors 105 into a single conductor or power bus. The circuit is completed by the return electrical bus 108 from the load 106 to the secondary 101.

Current measurement is achieved by selection of a subset of the independent conductors 105 (in this example a single conductor 109) which connect via a current sense resistor 102. The current sense resistor 102 has both a resistive impedance component (the reactance) 103 as well as an inductive impedance component 104. The voltage sensor 107 reads the voltage drop across the current sense resistor 102.

The voltage sensor readings 107 and the impedance of the resistor 102 are used to derive current. Since the impedance matched, tightly coupled conductors 105 share current produced by the secondary 101, the total current delivered to the load 106 can be calculated. For example, when a single conductor 109 is measured, the total current is n(V/Rz) where n is the number of conductors (e.g. n=1 for single conductor), V is the measured voltage across the sense resistor 102, and Rz is the impedance of the sense resistor 102.

FIG. 2

Figure 2:
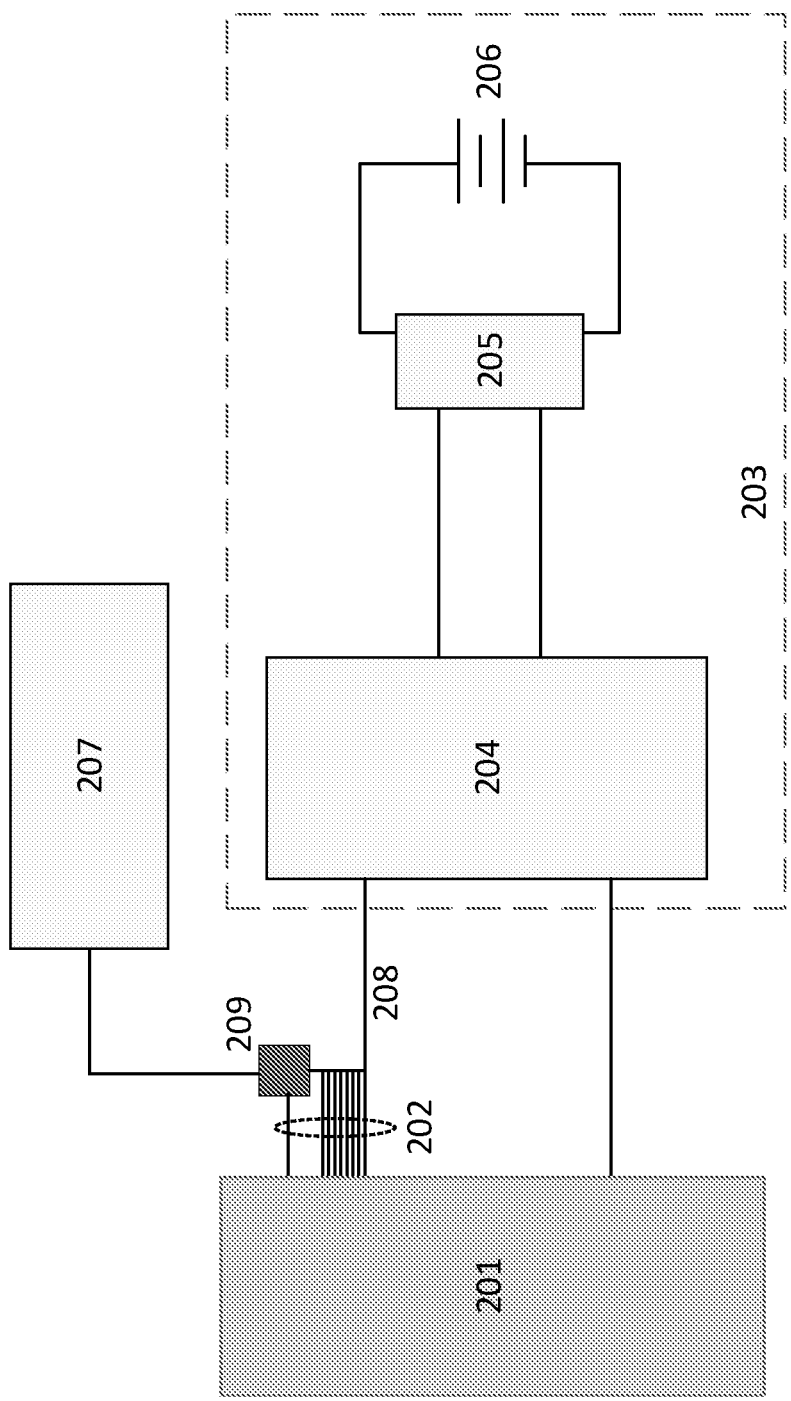
FIG. 2 functionally illustrates a wireless power transfer system that uses current measurements in a sample embodiment.

In FIG. 2, a high-level schematic for a direct current battery charging circuit using magnetic induction with current measurement in a sample embodiment is shown. The receiver 201 or secondary consists of a secondary coil with multiple windings 202. The receiver 201 can be inductive, resonant inductive or capacitive. The receiver 201 converts the magnetic field from the transmitter (not shown) into an alternating electrical current. The alternating current 208 developed by the resonant network 201 is used to power the load 203. The first stage of the load is a passive (diode-based) or active (switch-based) rectifier 204 that can be used to convert the alternating current to the direct current needed to charge the battery 206 (a battery may be wet, dry, solid state, capacitive or hybrid (e.g. a battery with capacitive component)). For charging a battery 206, the rectified DC signal may be smoothed and level-converted by the conditioner circuitry 205.

The current sensor 209 is used to monitor the alternating current 208 developed by the receiver 201. The current level, frequency, and phase is reported to the controller 207. The controller 207 may report electrical signal characteristics to ancillary systems such as displays, closed loop control systems, safety systems, and active rectification control switching.

FIG. 3

Figure 3:
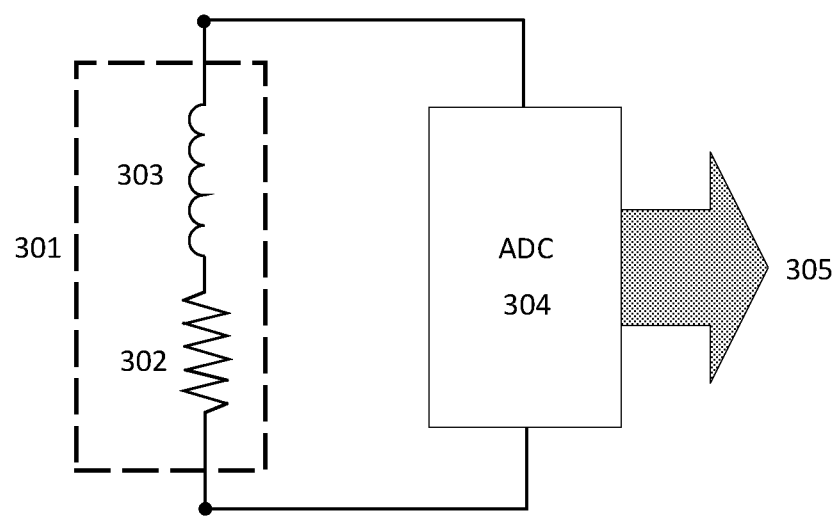
FIG. 3 illustrates current measurement hardware in a sample embodiment.

FIG. 3 shows an example embodiment of a current sensor using a current sense resistor 301. The current sense resistor 301 has both resistive (ohmic) 302 and inductive 303 impedance components. In this example, an Analog-to-Digital Converter (ADC) 304, is used to digitize the voltage produced across the current sense resistor 301. The ADC 304 connects to other systems, such as an active rectification controller 207, using a digital interface 305. The active rectification controller 207 may include a processor that calculates the current from the measured values as described herein.

As an example, for a WPT system with a 60 conductive element receiver with a single conductor measured, the current through the measured conductor would be $i=V/\sqrt{(R^2+(2\pi*L*f)^2)}$, where i is the single conductor current in Amps, V is the measured voltage in Volts, R is the resistor value in Ohms, L is a parasitic inductance of the current sense resistor in Henrys, and f is the frequency of the AC signal in Hertz.

FIG. 4

Figure 4:
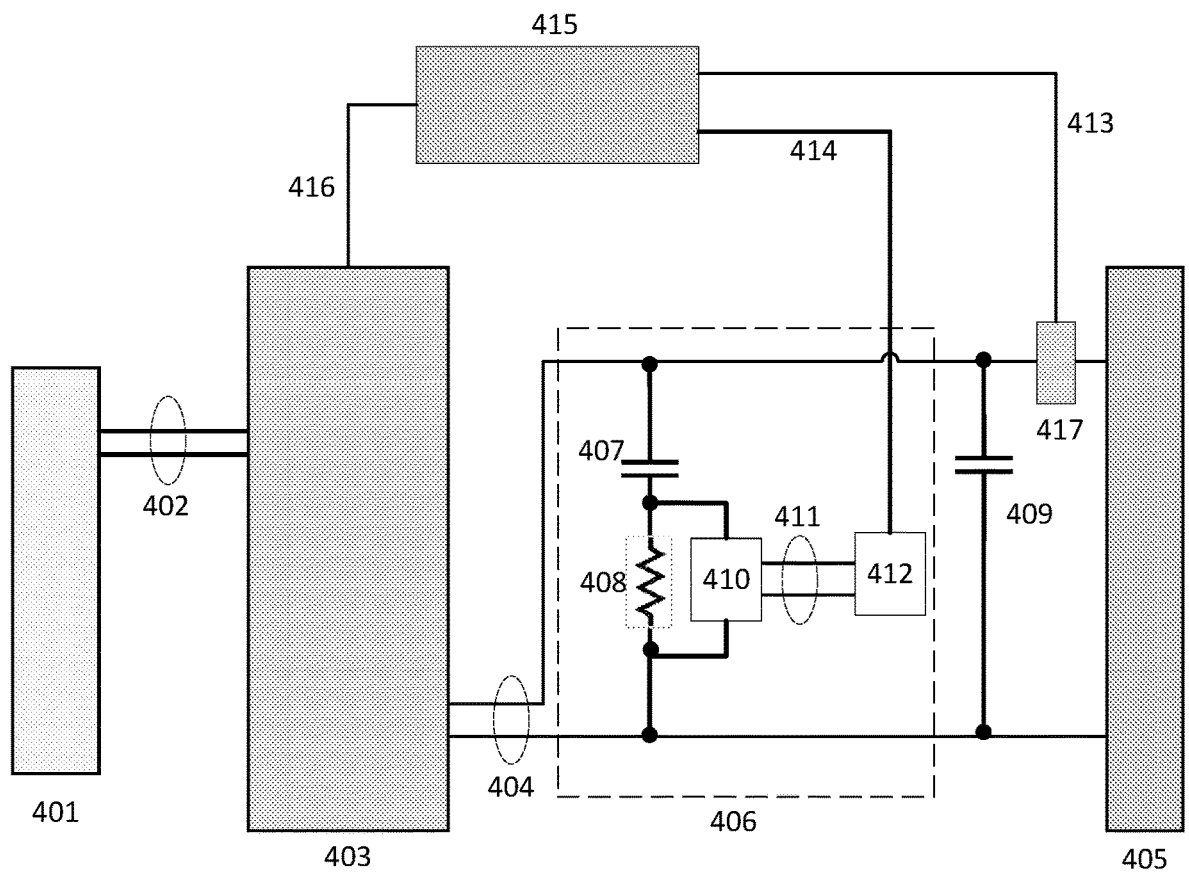
FIG. 4 schematically depicts an exemplary shunt capacitor current sensing circuit for high bandwidth current measurement in a sample embodiment.

FIG. 4 schematically depicts an exemplary shunt capacitor current sensing circuit for high bandwidth current measurement in a sample embodiment. FIG. 4 depicts the receiver subsystem (aka secondary) of a wireless power transfer (WPT) system for the powering of electronics and charging of energy storage systems (e.g., chemical or solid-state batteries, reversable fuel cells, ultra-capacitors, etc.). One application for such a system is the charging of an electric vehicle. The embodiment of FIG. 4 is a high-level depiction including the circuitry needed for high bandwidth current measurement.

In a WPT system using a magnetic resonance inductive circuit, the resonant network 401 is a high quality current source with a center frequency of 85,000 Hertz (nominally allowed to range between 79-90 kHz). The impedance of the resonant network allows it to source current within a narrow band of the resonant frequency and harmonics. The rectifier 403 turns the narrow band AC current received over AC electrical bus 402 into DC current with harmonics at even multiples of the fundamental frequency. The rectifier stage 403 in FIG. 4 may be a safety rectifier of the type taught in U.S. patent application Ser. No. 16/952,933, filed Nov. 19, 2020, entitled "SAFETY CIRCUITS FOR WIRELESS POWER TRANSFER." The harmonic currents from the rectifier 403 are shunted by the current sense circuitry 406 and 409, and the DC currents pass through the current and voltage sensor 417 to the load. A 'fractional current sensor' of the type described in U.S. patent application Ser. No. 16/825,624, filed Mar. 20, 2020, entitled "CURRENT SENSING IN A WIRELESS POWER TRANSFER SYSTEM" may be used to provide current sensing in the AC electrical bus 402 and the DC electrical bus 404 in sample embodiments.

In the embodiment of FIG. 4, the charging signal is delivered to the secondary coil assembly of the resonant network 401 via magnetic flux for conversion into an electrical current. The received AC electrical signal is delivered by the high-power wired AC bus 402 to the rectification subsystem 403. The AC signal is rectified to a DC signal suitable for battery charging before being delivered via the high-power DC bus 404 to the power storage subsystem 405.

To allow for high bandwidth current measurement, AC current sense circuitry 406 is inserted between the rectification subsystem 403 of the secondary coil of the resonant network 401 and the power storage subsystem 405. Two new parallel paths are created. The first path includes a filter capacitor 407 and a sense resistor 408. The second path includes the smoothing capacitor 409. Both the first and second paths are in parallel with each other and the power load/storage subsystem 405. Any pre-existing smoothing capacitor or capacitor bank is included in the smoothing capacitor 409.

The current sense resistor 408 will only be exposed to the ripple current (AC current noise on the rectified DC base). By putting the current sensing resistor 408 in line with the filter capacitor 407, the AC current sense circuitry 406 eliminates the DC load current from the rectification subsystem 403 and allows a voltage measurement of the noise that is added to the DC load current.

The voltage produced over the sense resistor 408 is bandpass filtered and amplified by the low noise amplifier (LNA) 410. The filtered and amplified voltage is passed over a bus 411 to the digitizer 412 (nominally an Analog to Digital Converter with high dynamic range). The digitizer 412 samples the pre-filtered and amplified voltage at a frequency over the expected Nyquist rate. This digital information is sent to the vehicle charging controller 415 for analysis via digital datalink 414.

The capacitive partial current sense circuit measurement in 406 may be combined with the switch states of the rectifier 403 controlled by vehicle charging controller 415 to determine the current waveform after the rectifier at 404. Based on Kirchoff's Current Law, the calculated current at 404 added with measured current by current sense circuitry 406 is equal to the current at current and voltage sensor 417. This provides a high bandwidth measurement for the output current that is provided to the vehicle charging controller 415 via digital datalink 413.

Under normal operation, the current through AC current sense circuitry 406 and the smoothing capacitor 409 will only have significant AC components at double multiples of the operating frequency. A loss of load from the power storage subsystem 405 will force a direct current through the AC current sense circuitry 406 and the smoothing capacitor 409. Digital processing in the vehicle charging controller 415 with a low pass filter with a cutoff frequency less than twice the operating frequency will produce a signal when a loss of load happens.

Changes in the controller power set point will also introduce a small component to the measurement at frequencies below the operating frequency. However, these changes can be accounted for by using the calculating the higher bandwidth current measurement at the output. The higher bandwidth calculation of the output current provides a ripple estimate of the output of the system.

Alternative Embodiment—Multiple Parallel Current Sensing

Once the single conductor current (i) is calculated, the current is multiplied by the number of tightly coupled conductors to determine a system current level. In other words, the current would be $i=nV/sqrt[(R^2+(2n*L*f)^2]$, where n is the number of conductors. In cases where multiple conductors are measured, the sum of individual measured currents are averaged. This average per conductor current is then multiplied by the number of tightly coupled conductors to determine the total system current level.

In the simplest case, a single conductor is separated from the tightly inductively coil windings for fractional current sensing. In some cases, multiple conductors can be sensed, each with its own current sense resistor. In the case of multiple conductors, the sensed current is averaged and then multiplied:

$$i(total)=\{\Sigma[(Vn/Rn)/n]\}*m$$

where i(total) is the system current, Vn is the sampled voltage in conductors 1 to n, and Rn is the current resistors impedance for each resistor, where n is the number of conductors sampled and m is the total number of conductors.

Alternative Embodiment—Unknown Parasitic Induction

For high power (i.e., high current) systems, using a single current sense resistor to sense the entire alternating current is not desirable because of the power dissipation (via heating) in that resistor. This heating can be mitigated by using an arbitrarily small value resistor. However, when the resistance value becomes too small, the impedance of the sense resistor starts to be dominated by reactance, i.e. the parasitic inductance of the sense resistor. This reactance dominance leads to unwanted phase shifts and also affects the magnitude of the measurement of the alternating current as follows:

$$v(t)=i(t)*[sqrt(R^2+(2\pi*L*f)^2)]$$

where v(t) is the voltage, i(t) is the current, R is the ohmic value of the sense resistor, L is the parasitic inductance inherent in the sense resistor, and f is the frequency of the AC signal.

Since voltage, v(t), is the quantity that is measured by the measurement system (see, e.g., FIG. 3), it can be seen by inspection that if the quantity under the radical increases, then the sensed voltage, v(t) will increase. So, in the case of a sense resistor where R<<X, (where X=2π*L*f), the sensed voltage, from which the current is computed, will be dominated by the inductance. If the exact inductance is unknown, then it is nearly impossible to compute an accurate current. However, the system and method of fractional current sensing of tightly coupled parallel conductors circumvents this problem by allowing R to be >>X.

For example, if n=60 conductors, when sensing 1/60 of the total current (a single conductor of the total), the resistance of the sense resistor can be 60× greater than the case of using a single sense resistor to sense to total current. More generally, R≥nX, where n is the number of coil windings of the coil. This, of course, assumes that the power dissipation of the sense resistor is held constant.

The advantage of the fractional sensing concept is that with R>>X, not only is the phase angle very close to zero, but the amplitude of the voltage signal is dominated by the real component of the impedance, that is, the ohmic resistance. So practically speaking, knowing the exact parasitic inductance of the sense resistor is not necessary for computing an accurate voltage measurement (and thus current level, phase and frequency) as long as the resistance component is much larger than the reactance created by the inductive component.

CONCLUSION

While various implementations have been described above, it should be understood that they have been presented by way of example only, and not limitation. For example, any of the elements associated with the systems and methods described above may employ any of the desired functionality set forth hereinabove. Thus, the breadth and scope of a preferred implementation should not be limited by any of the above-described sample implementations.

As discussed herein, the logic, commands, or instructions that implement aspects of the methods described herein may be provided in a computing system including any number of form factors for the computing system such as desktop or notebook personal computers, mobile devices such as tablets, netbooks, and smartphones, client terminals and server-hosted machine instances, and the like. Another embodiment discussed herein includes the incorporation of the techniques discussed herein into other forms, including into other forms of programmed logic, hardware configurations, or specialized components or modules, including an apparatus with respective means to perform the functions of such techniques. The respective algorithms used to implement the functions of such techniques may include a sequence of some or all of the electronic operations described herein, or other aspects depicted in the accompanying drawings and detailed description below. Such systems and computer-readable media including instructions for implementing the methods described herein also constitute sample embodiments.

The monitoring and control functions of the controller 207 described herein may be implemented in software in one embodiment. The software may consist of computer executable instructions stored on computer readable media or computer readable storage device such as one or more non-transitory memories or other type of hardware-based storage devices, either local or networked. Further, such functions correspond to modules, which may be software, hardware, firmware, or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server, or other computer system, turning such computer system into a specifically programmed machine.

Examples, as described herein, may include, or may operate on, processors, logic, or a number of components, modules, or mechanisms (herein "modules"). Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. The software, when executed by the underlying hardware of the module, causes the hardware to perform the specified operations.

Accordingly, the term "module" is understood to encompass a tangible hardware and/or software entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Those skilled in the art will appreciate that the topology and circuit implementation methodology described herein enables effective realization as a single application specific integrated circuit. Further, while the disclosure contained herein pertains to the provision of electrical power to vehicles, it should be understood that this is only one of many possible applications, and other embodiments including non-vehicular applications are possible. For example, those skilled in the art will appreciate that there are numerous applications of providing a current source safety circuit in non-vehicle inductive charging applications such as portable consumer electronic device chargers, such as those (e.g., PowerMat™) used to charge toothbrushes, cellular telephones, and other devices. Accordingly, these and other such applications are included within the scope of the following claims.

What is claimed:

1. A method of measuring current through a coil comprising a plurality of coil windings configured to provide an alternating current (AC) signal to a rectification subsystem and to provide power to a power storage subsystem of a wireless power transfer system, comprising:
   connecting an alternating current (AC) sense circuit including a current sensing resistor between the power storage subsystem and the rectification subsystem that receives the AC signal from the plurality of coil windings, the AC sense circuit comprising a first path including at least one filter capacitor and the current sensing resistor and a second path in parallel with the first path, the second path including a smoothing capacitor, the current sense resistor measuring a current through the plurality of coil windings, wherein the first and second paths are in parallel with the power storage subsystem;
   measuring a voltage drop across the current sensing resistor;
   digitizing a voltage across the current sensing resistor and outputting the digitized voltage as a fractional current through the coil; and
   determining the fractional current and a phase of the coil from the measured current and voltage.

2. The method of claim 1, further comprising placing the current sensing resistor in line with the at least one filter capacitor so as to receive a ripple current added to a direct current (DC) load current by the rectification subsystem, and the current sensing resistor and the at least one filter capacitor eliminating the DC load current from the rectification subsystem to allow a voltage measurement of the ripple current.

3. The method of claim 2, further comprising bandpass filtering and amplifying a voltage produced by the ripple current over the current sensing resistor by a low noise amplifier, passing a filtered and amplified voltage over a bus to a digitizer, and sampling, by the digitizer, the filtered and amplified voltage at a frequency over an expected Nyquist rate.

4. The method of claim 3, further comprising sending an output of the digitizer to a vehicle charging controller of a vehicle to be charged by the coil using wireless power transfer.

5. The method of claim 4, further comprising controlling switch states of the rectification subsystem using the vehicle charging controller and combining the calculated total current with the switch states of the rectification subsystem to determine a current waveform output by the rectification subsystem.

6. The method of claim 1, wherein the coil is a secondary winding used in a wireless power transfer system comprising the rectification subsystem, further comprising the rectification subsystem converting an alternating current on the secondary winding into a direct current for application to a load.

7. The method of claim 1, wherein a loss of load from the power storage subsystem forces a direct current through the AC current sense circuit and the smoothing capacitor, further comprising processing the direct current forced through the AC current sense circuit to produce a signal and providing the signal to the rectification subsystem as indicative of the loss of load.

8. A wireless power transfer system comprising:
   a rectification subsystem;
   a power storage subsystem;
   a coil comprising a plurality of coil windings that is configured to provide an alternating current (AC) signal to the rectification subsystem and to provide power to the power storage subsystem; and
   a current sensing device for measuring current through the coil, comprising:
   an alternating current (AC) sense circuit including a current sensing resistor between the power storage subsystem and the rectification system, the current sensing resistor receiving an AC signal from the plurality of coil windings for measuring a current through the plurality of coil windings, the AC sense circuit comprising a first path including at least one filter capacitor and the current sensing resistor, a second path in parallel with the first path, the second path including a smoothing capacitor, wherein the first and second paths are in parallel with the power storage subsystem, and an analog to digital converter that digitizes a voltage across the current sensing resistor and outputs the digitized voltage as a fractional current through the coil;
   a voltage sensor that measures a voltage drop across the current sensing resistor; and
   a processor that determines the fractional current and phase of the coil from the measured current and voltage.

9. The wireless power transfer system of claim 8, wherein the coil is a secondary winding and the rectification subsystem converts an alternating current on the secondary winding into a direct current for application to a load.

10. The wireless power transfer system of claim 8, wherein the coil windings comprise one of Litz wire, printed circuit board traces, and conductive filaments and are impedance matched and tightly coupled via mutual inductance with each other.

11. The wireless power transfer system of claim 8, wherein the rectification subsystem receives an AC current from the plurality of coil windings and provides a direct current (DC) output to the AC current sense circuit.

12. The wireless power transfer system of claim 8, wherein the current sensing resistor is in line with the at least one filter capacitor so as to receive a ripple current added to a DC load current by the rectification subsystem, and wherein the current sensing resistor and the at least one filter capacitor eliminate the DC load current from the rectification subsystem to allow a voltage measurement of the ripple current.

13. The wireless power transfer system of claim 12, further comprising an amplifier and a digitizer, wherein the amplifier bandpass filters and amplifies a voltage produced by the ripple current over the current sensing resistor and passes a filtered and amplified voltage to the digitizer, and wherein the digitizer samples the filtered and amplified voltage at a frequency over an expected Nyquist rate.

14. The wireless power transfer system of claim 13, wherein the digitizer provides a digitized output to a vehicle charging controller of a vehicle to be charged by the coil using wireless power transfer, wherein the vehicle charging controller switches states of the rectification subsystem.

15. The wireless power transfer system of claim 14, wherein the processor calculates a total current through the coil and combines the calculated total current with switch states of the rectification subsystem to determine a current waveform output by the rectification subsystem.

16. The wireless power transfer system of claim 14, wherein a loss of load from the power storage subsystem forces a direct current through the AC current sense circuit and the smoothing capacitor, wherein the vehicle charging controller processes the direct current forced through the AC current sense circuit to produce a signal that is sent to the rectification subsystem when the loss of load is detected.

* * * * *